(12) United States Patent
Iwasaki

(10) Patent No.: US 9,613,950 B1
(45) Date of Patent: Apr. 4, 2017

(54) SEMICONDUCTOR DEVICE

(71) Applicant: TOYOTA JIDOSHA KABUSHIKI KAISHA, Toyota-shi, Aichi-ken (JP)

(72) Inventor: Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/218,819

(22) Filed: Jul. 25, 2016

(30) Foreign Application Priority Data

Sep. 17, 2015 (JP) ................. 2015-184349

(51) Int. Cl.
*H01L 29/66* (2006.01)
*H01L 27/06* (2006.01)
*H01L 29/739* (2006.01)
*H01L 29/10* (2006.01)
*H01L 29/32* (2006.01)

(52) U.S. Cl.
CPC ...... *H01L 27/0664* (2013.01); *H01L 29/1095* (2013.01); *H01L 29/32* (2013.01); *H01L 29/7397* (2013.01)

(58) Field of Classification Search
CPC . H01L 29/32; H01L 29/7397; H01L 29/1095; H01L 27/0664; H01L 29/861; H01L 29/0834; H01L 27/0629
See application file for complete search history.

(56) References Cited

U.S. PATENT DOCUMENTS

| 8,168,999 B2* | 5/2012 | Tsuzuki et al. | H01L 29/167 257/143 |
| 8,330,185 B2* | 12/2012 | Soeno | H01L 27/0664 257/133 |
| 2009/0278166 A1* | 11/2009 | Soeno et al. | H01L 27/0664 257/133 |

FOREIGN PATENT DOCUMENTS

JP 2015-118991 A 6/2015

* cited by examiner

*Primary Examiner* — Yosef Gebreyesus
(74) *Attorney, Agent, or Firm* — Oliff PLC

(57) ABSTRACT

In a semiconductor device including an IGBT and a diode, an upper-side lifetime control region, which is provided in the drift region within a range located above an intermediate depth of the drift region, is provided in a diode area and is not provided in an IGBT area. A first inter-trench semiconductor region, which is adjacent to a second inter-trench semiconductor region in a diode area, includes a barrier region of an n-type located between the body region and the drift region and a pillar region of the n-type extending from a position being in contact with the upper electrode to a position being in contact with the barrier region. Each of the second inter-trench semiconductor regions in the diode area does not include the pillar region.

3 Claims, 9 Drawing Sheets

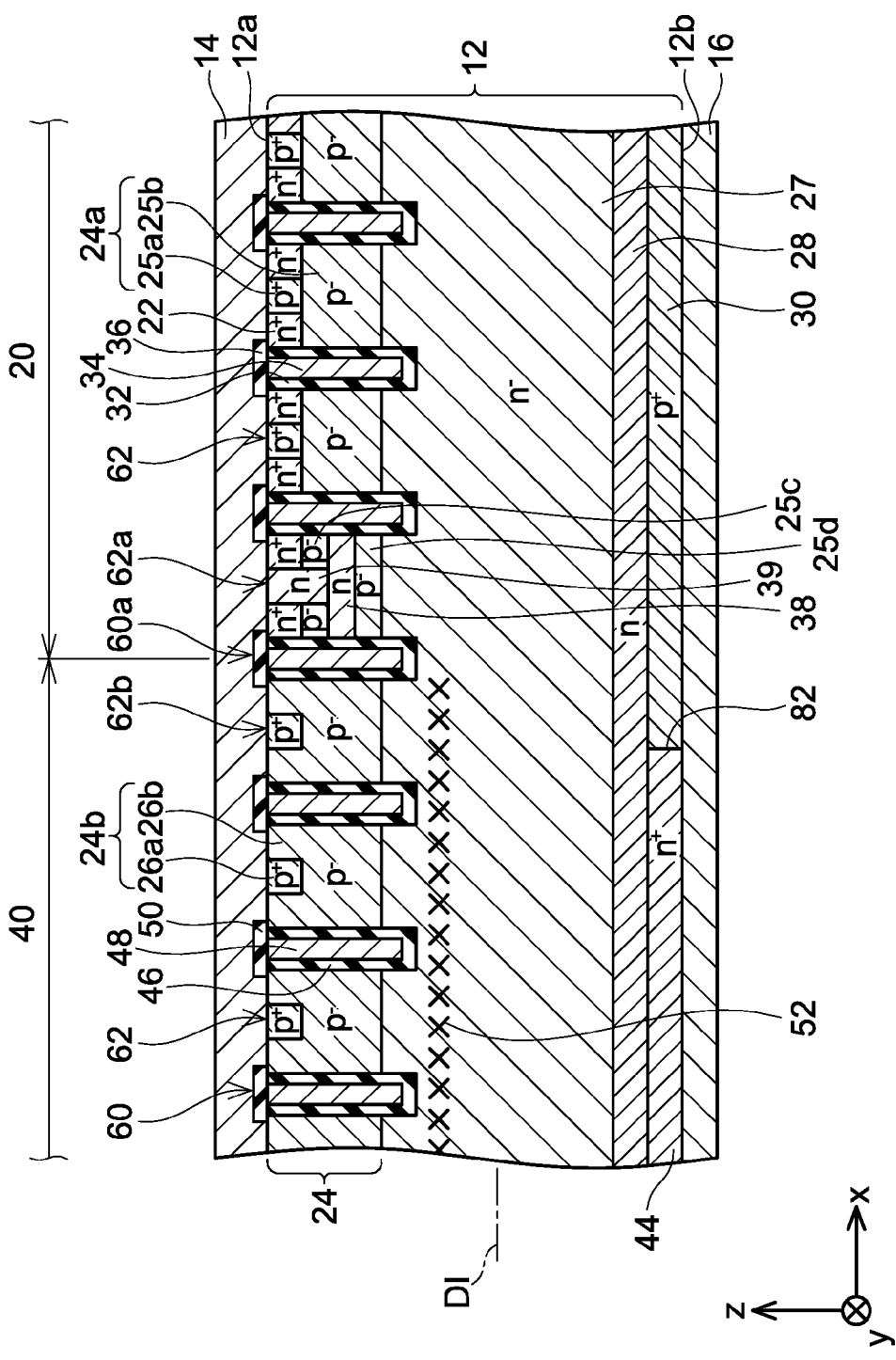

US 9,613,950 B1

SEMICONDUCTOR DEVICE

CROSS-REFERENCE TO RELATED APPLICATION

This application claims priority to Japanese Patent Application No. 2015-184349 filed on Sep. 17, 2015, the contents of which are hereby incorporated by reference into the present application.

TECHNICAL FIELD

The technique disclosed herein relates to a semiconductor device including an IGBT (Insulated Gate Bipolar Transistor) and a diode.

BACKGROUND ART

Japanese Patent Application Publication No. 2015-118991 discloses a semiconductor device that includes an IGBT and a diode. In this semiconductor device, a plurality of trenches is provided in a front surface of the semiconductor substrate. Gate electrodes isolated from the semiconductor substrate are provided in the trenches in an IGBT area. Dummy electrodes isolated from the semiconductor substrate are provided in the trenches in a diode area. The semiconductor substrate includes a plurality of inter-trench semiconductor regions, each of which is intervened between two trenches. An n-type emitter region and a p-type body region are provided in the inter-trench semiconductor regions of the IGBT area. A p-type anode region is provided in the inter-trench semiconductor regions of the diode area. Further, an n-type drift region is arranged under the body region and the anode region. A p-type collector region and an n-type cathode region are provided under the drift region. The collector region is provided in the IGBT area. The cathode region is provided in the diode area. An IGBT is configured in the IGBT area by the emitter region, the body region, the drift region, the collector region, the gate electrodes, and the like. A diode is configured in the diode area by the anode region, the drift region, the cathode region, and the like. Further, in this semiconductor device, a lifetime control region (crystal defect region) is provided in the drift region. The lifetime control region is a region having a higher crystal defect density than its surrounding drift region. The lifetime control region is provided within the diode area, as well as within the IGBT area at a position in proximity to the diode area. That is, the lifetime control region is provided so that it protrudes from the diode area into the IGBT area. Further, the lifetime control region is disposed above an intermediate depth of the drift region (center position of the drift region in a thickness direction of the semiconductor substrate). When the lifetime control region is provided in the drift region above the intermediate depth in the diode area, carriers in the drift region upon a reverse recovery operation of the diode are efficiently recombined within the lifetime control region. Due to this, a reverse recovery loss of the diode is suppressed. Further, at a border between the IGBT area and the diode area, a parasitic diode is created on a passage extending from the body region in the IGBT area to the cathode region through the drift region. This parasitic diode at the border operates when the diode in the diode area operates. In this semiconductor device, the reverse recovery loss is suppressed by the lifetime control region protruding within the IGBT area from the diode area upon a reverse recovery operation of the parasitic diode at the border. Accordingly, in this semiconductor device, the reverse recovery loss is suppressed not only in the diode of the diode area but in the parasitic diode at the border as well.

SUMMARY

As described above, in the semiconductor device of Japanese Patent Application Publication No. 2015-118991, the lifetime control region is provided so that it protrudes from the diode area into the IGBT area. That is, the lifetime control region is provided partially within the IGBT area. When the lifetime control region is provided in the IGBT area, an on-voltage of the IGBT increases and a steady-state loss is more likely to occur in the IGBT. In a case where the lifetime control region in the IGBT area is provided under the intermediate depth of the drift region (on a collector region side), the on-voltage of the IGBT increases while a switching loss of the IGBT is suppressed, as a result of which becomes advantageous for the IGBT when a switching speed is fast. On the other hand, in a case where the lifetime control region in the IGBT area is provided above the intermediate depth of the drift region (on a body region side), its contribution to an improvement of IGBT characteristic is small, and the on-voltage of the IGBT is increased. Due to this, if the lifetime control region is provided to protrude from the diode area into the IGBT area in a range above the intermediate depth of the drift region as in Japanese Patent Application Publication No. 2015-118991, this serves as a disadvantage to the IGBT characteristic. Thus, the present disclosure aims to provide a technique, in a semiconductor device including an IGBT and a diode, that suppresses degrading in IGBT characteristic while suppressing a reverse recovery loss in a diode in a diode area and a parasitic diode at a border.

A semiconductor device disclosed herein includes an IGBT and a diode. The semiconductor device comprises a semiconductor substrate; an upper electrode covering an upper surface of the semiconductor substrate; and a lower electrode covering a lower surface of the semiconductor substrate. The semiconductor substrate comprises a body region, a drift region, a cathode region, and a collector region. The body region is of a p-type and being in contact with the upper electrode. The drift region is of an n-type and located on a lower side of the body region. The cathode region is of the n-type and located in a part of a range on a lower side of the drift region, being in contact with the lower electrode, and having an n-type impurity concentration higher than the drift region. The collector region is of the p-type and located in another part of the range on the lower side of the drift region, and being in contact with the lower electrode at a position bordering the cathode region. A plurality of trenches is provided in the upper surface of the semiconductor substrate, the plurality of trenches penetrating the body region and reaching the drift region. A trench electrode insulated from the semiconductor substrate and the upper electrode by an insulating film is located in each of the trenches. The semiconductor substrate comprises a plurality of inter-trench semiconductor regions, each of the inter-trench semiconductor regions being intervened between the adjacent trenches. The plurality of inter-trench semiconductor regions comprises a plurality of first inter-trench semiconductor regions adjacent to each other and a plurality of second inter-trench semiconductor regions adjacent to each other. Each of the first inter-trench semiconductor regions comprises an emitter region of the n-type being in contact with the upper electrode and insulating film and separated from the drift region by the body region. Each of the second inter-trench semiconductor regions does not comprise the emitter region. A range in which the plurality of first inter-trench semiconductor regions is located in a plan view of the semiconductor substrate is an IGBT area, and a range in which the plurality of second inter-trench semiconductor regions is located in the plan view of the semiconductor substrate is a diode area. At least a part of the collector region is located in the IGBT area. At least a part of the cathode region is located in the diode area. A border between the cathode region and the collector region is located in a range directly below a border trench and two of the inter-trench semiconductor regions bordering the border trench, the border trench being one of the trenches that is located at a border between the IGBT area and the diode area. An upper-side lifetime control region is provided in the diode area and is not provided in the IGBT area, the upper-side lifetime control region being a region extending along a planar direction in the drift region within a range located above an intermediate depth of the drift region, and the upper-side lifetime control region having a crystal defect density higher than the drift region surrounding the upper-side lifetime control region. One of the first inter-trench semiconductor regions that is adjacent to the second inter-trench semiconductor regions is a border first inter-trench semiconductor region. The border first inter-trench semiconductor region comprises: a barrier region of the n-type located between the body region and the drift region and having an n-type impurity concentration higher than the drift region; and a pillar region of the n-type extending from a position being in contact with the upper electrode to a position being in contact with the barrier region. Each of the second inter-trench semiconductor regions does not comprise the pillar region.

Notably, within the aforementioned body region, the body region within the diode area is a region that functions as an anode of the diode. Further, the aforementioned collector region simply needs to be provided at least partially within the IGBT area, and the cathode region may be protruding from the diode area into the IGBT area. Further, the aforementioned cathode region simply needs to be provided at least partially within the diode area, and the collector region may be protruding from the IGBT area into the diode area.

In this semiconductor device, an IGBT is configured of the emitter region, the body region, the drift region, the collector region, the trench electrode and the like in the IGBT area. Further, in the diode area, a diode is configured of the body region (anode region), the drift region, the cathode region and the like. Since the upper-side lifetime control region is provided in the drift region in the diode area, a reverse recovery loss in the diode in the diode area is suppressed. Further, in the IGBT area, no increase in a steady-state loss of the IGBT occurs due to the upper-side lifetime control region not being provided therein. Further, a parasitic diode at the border is created by the body region, the drift region, and the cathode region in the first inter-trench semiconductor region at the border. In this semiconductor device, a reverse recovery loss of the parasitic diode at the border is suppressed by the barrier region and the pillar region that first inter-trench semiconductor region at the border includes. Hereinbelow, an operation of the parasitic diode at the border will be described. When a potential of the upper electrode is increased, electrons begin to flow from the lower electrode to the upper electrode through the cathode region, the drift region, the barrier region, and the pillar region. That is, the electrons flow at a stage where the potential of the upper electrode is still increasing. Since the barrier region is connected to the upper electrode via the pillar region, a potential difference at this stage between the barrier region and the upper electrode is small. Due to this, a potential difference is less likely to occur at a pn junction at an interface between the barrier region and the body region, and at this stage, this pn junction does not turn on. When the potential of the upper electrode is further increased, a current by the aforementioned electrons increases, and the potential difference between the barrier region and the upper electrode becomes larger. When this potential difference reaches a predetermined potential difference, the pn junction at the interface between the barrier region and the body region turns on, and holes flow from the upper electrode into the drift region through the body region and the barrier region. Accordingly, in this parasitic diode, the electrons flow through the barrier region and the pillar region before the pn junction at the interface between the barrier region and the body region turns on. Due to this, a timing at which the pn junction turns on is delayed, and the holes are suppressed from flowing into the drift region. Accordingly, upon the reverse recovery operation of the parasitic diode, the holes that are discharged from the drift region to the upper electrode are reduced in their number. Thus, in this diode, the reverse recovery loss is suppressed. As described above, in this semiconductor device, the reverse recovery loss of the diode in the diode area and the reverse recovery loss of the parasitic diode at the border can be suppressed while suppressing the steady-state loss in the IGBT as well.

BRIEF DESCRIPTION OF DRAWINGS

FIG. 1 is a vertical cross sectional view of a semiconductor device 10 in an embodiment at a cross section including a pillar region 39 of a border inter-trench semiconductor region 62a;

FIG. 2 is a vertical cross sectional view of the semiconductor device 10 in the embodiment at a cross section including body contact regions 25a of the border inter-trench semiconductor region 62a;

FIG. 9 is a vertical cross sectional view of a semiconductor device of a sixth variant corresponding to FIG. 1.

DETAILED DESCRIPTION

Figure 1:
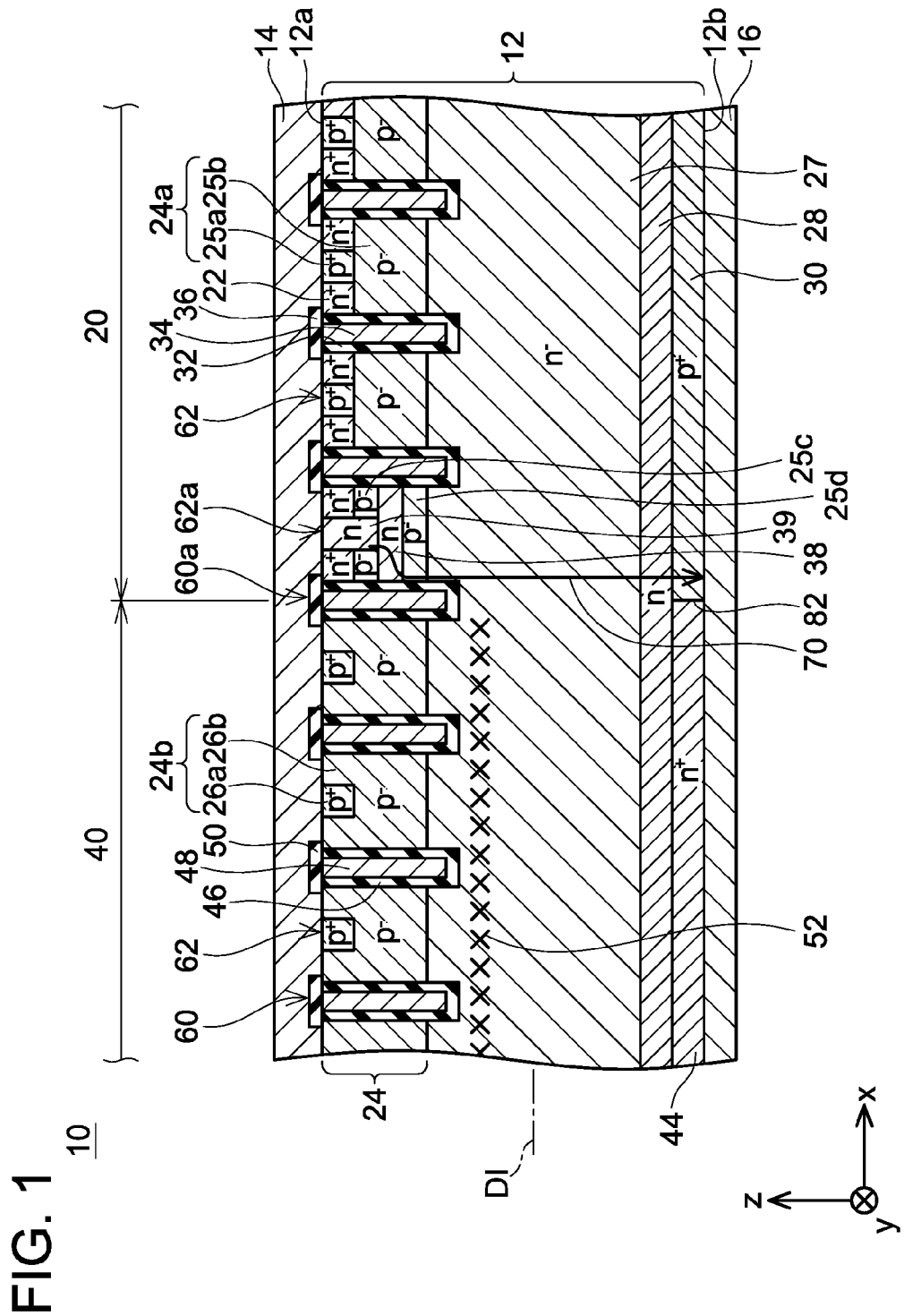
Figure 2:
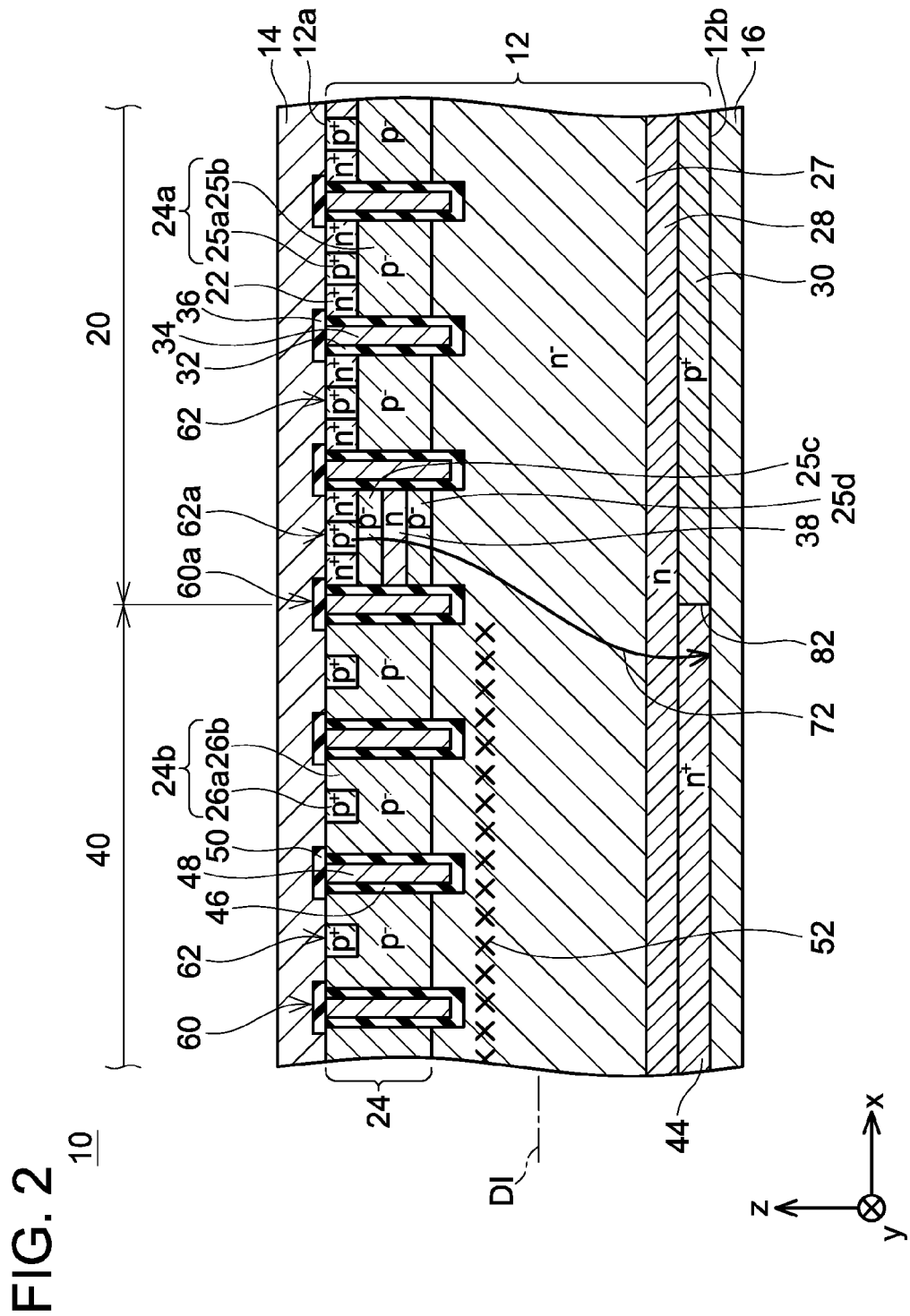
Figure 3:
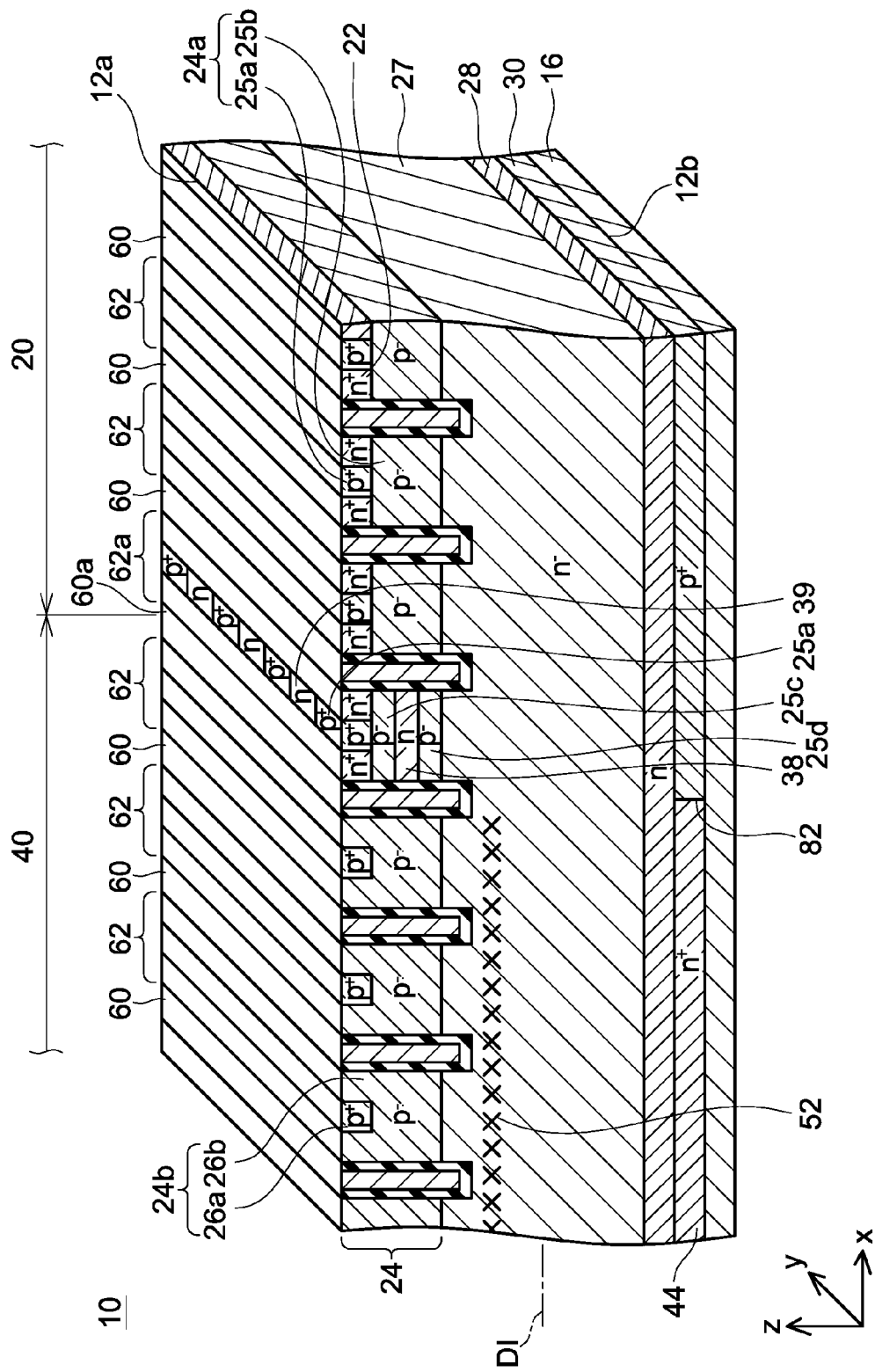
FIG. 3 is a perspective cross sectional view of the semiconductor device 10 in the embodiment (a view that omits an upper electrode 14 and interlayer insulating films)

A semiconductor device 10 in an embodiment shown in FIGS. 1 to 3 comprises a semiconductor substrate 12, an upper electrode 14, and a lower electrode 16. The semiconductor substrate 12 is a substrate made of silicon. The upper electrode 14 covers an upper surface 12a of the semiconductor substrate 12. The lower electrode 16 covers a lower surface 12b of the semiconductor substrate 12. Notably, in the description below, a thickness direction of the semiconductor substrate 12 is termed a z direction, and one direction parallel to the upper surface 12a of the semiconductor substrate 12 (one direction intersecting the z direction orthogonally) is termed an x direction, and a direction that orthogonally intersects the z direction and the x direction is termed a y direction.

The semiconductor substrate 12 comprises an IGBT area 20 where a vertical type IGBT is provided, and a diode area 40 where a vertical type diode is provided. The IGBT area 20 and the diode area 40 are adjacent to each other.

A body region 24 is provided in the semiconductor substrate 12. The body region 24 is a p-type region provided in a vicinity of the upper surface 12a of the semiconductor substrate 12. The body region 24 is arranged to extend over both the IGBT area 20 and the diode area 40. Notably, the body region 24 in the diode area 40 is a region that functions as an anode of the diode. Thus, hereinbelow, the body region 24 in the diode area 40 is termed an anode region 24b. Further, hereinbelow, the body region 24 in the IGBT area 20 is termed an IGBT body region 24a.

The IGBT body region 24a comprises body contact regions 25a and a low-concentration body region 25b. The body contact regions 25a have a high p-type impurity concentration. The body contact regions 25a are provided at ranges exposed on the upper surface 12a of the semiconductor substrate 12 and make ohmic contact with the upper electrode 14. The low-concentration body region 25b has a lower p-type impurity concentration than the body contact regions 25a. The low-concentration body region 25b is provided under the body contact regions 25a.

The anode region 24b comprises anode contact regions 26a and a low-concentration anode region 26b. The anode contact regions 26a have a high p-type impurity concentration. The anode contact regions 26a are provided at ranges exposed on the upper surface 12a of the semiconductor substrate 12 and make ohmic contact with the upper electrode 14. The low-concentration anode region 26b has a lower p-type impurity concentration than the anode contact regions 26a. The low-concentration anode region 26b is provided under and adjacently to the anode contact regions 26a.

A plurality of trenches 60 extending parallel to each other is provided in the upper surface 12a of the semiconductor substrate 12. As shown in FIG. 3, each of the trenches 60 extends long in the y direction in the upper surface 12a. Each of the trenches 60 extends in the z direction so as to penetrate the body region 24 from the upper surface 12a. Hereinbelow, each semiconductor region that is intervened between two adjacent trenches 60 will be termed an inter-trench semiconductor region 62. One of the trenches 60 extends along a border between the IGBT area 20 and the diode area 40. A plurality of trenches 60 is provided in the IGBT area 20, and another plurality of trenches 60 is provided in the diode area 40. Due to this, pluralities of inter-trench semiconductor regions 62 are provided respectively in the IGBT area 20 and the diode area 40.

An inner surface of each of the trenches 60 in the IGBT area 20 is covered by a gate insulating film 32. A gate electrode 34 is provided in each trench 60 in the IGBT area 20. Each of the gate electrodes 34 is insulated from the semiconductor substrate 12 by its corresponding gate insulating film 32. An upper surface of each gate electrode 34 is covered by an interlayer insulating film 36. Each gate electrode 34 is insulated from the upper electrode 14 by its corresponding interlayer insulating film 36. The gate electrodes 34 are connected to each other by a gate wiring that is not shown.

An inner surface of each of the trenches 60 in the diode area 40 is covered by an insulating film 46. A dummy electrode 48 is provided in each trench 60 in the diode area 40. Each of the dummy electrodes 48 is insulated from the semiconductor substrate 12 by its corresponding insulating film 46. An upper surface of each dummy electrode 48 is covered by an interlayer insulating film 50. Each dummy electrode 48 is insulated from the upper electrode 14 by its corresponding interlayer insulating film 50. The dummy electrodes 48 are connected to each other by a wiring that is not shown. Further, the dummy electrodes 48 are insulated from the gate electrodes 34. Thus, a potential of the dummy electrodes 48 is independent from a potential of the gate electrodes 34.

As described above, since all the trenches 60 penetrate the body region 24, each of the inter-trench semiconductor regions 62 includes the body region 24. More specifically, the inter-trench semiconductor regions 62 in the IGBT area 20 include the IGBT body region 24a. Further, the inter-trench semiconductor regions 62 in the diode area 40 include the anode region 24b.

Each of the inter-trench semiconductor regions 62 in the IGBT area 20 further includes an emitter region 22. The emitter regions 22 are n-type regions that contain n-type impurities at a high concentration. The emitter regions 22 are provided in ranges exposed on the upper surface 12a of the semiconductor substrate 12, and make ohmic contact with the upper electrode 14. The emitter regions 22 are provided at positions in contact with their corresponding gate insulating films 32. As shown in FIG. 3, the emitter regions 22 extend long along the trenches 60 in the y direction. One body contact region 25a is arranged each at a position between two emitter regions 22. Further, the low-concentration body region 25b makes contact with the gate insulating films 32 at positions under the emitter regions 22. The emitter regions 22 are provided in all of the inter-trench semiconductor regions 62 in the IGBT area 20. No emitter region 22 is provided in the inter-trench semiconductor regions 62 in the diode area 40. In other words, a range where the inter-trench semiconductor regions 62 including the emitter regions 22 are provided adjacent to one another in plurality is the IGBT area 20, and a range where the inter-trench semiconductor regions 62 not including the emitter regions 22 are provided adjacent to one another in plurality is the diode area 40.

The inter-trench semiconductor region 62 within the IGBT area 20 and arranged closest to the diode area 40 is hereinbelow termed a border inter-trench semiconductor region 62a. The border inter-trench semiconductor region 62a further includes a barrier region 38 and a plurality of pillar regions 39.

The barrier region 38 is an n-type region, and is provided at a center portion in the z direction within the low-concentration body region 25b. The barrier region 38 extends in the x direction and the y direction in the border inter-trench semiconductor region 62a, and makes contact with the gate insulating films 32 that are on both sides of the border inter-trench semiconductor region 62a. The barrier region 38 separates the low-concentration body region 25b in the border inter-trench semiconductor region 62a into an upper low-concentration body region 25c and a lower low-concentration body region 25d. A p-type impurity concentration in the lower low-concentration body region 25d is somewhat lower than a p-type impurity concentration in the upper low-concentration body region 25c. An n-type impurity concentration in the barrier region 38 is lower than an n-type impurity concentration in the emitter regions 22.

As shown in FIG. 3, in a range intervened between two emitter regions 22 at a surface portion of the border inter-trench semiconductor region 62a, the body contact regions 25a and the pillar regions 39 are arranged alternately along the y direction. Each of the pillar regions 39 is an n-type region having a lower n-type impurity concentration than the emitter regions 22. Each of the pillar regions 39 is exposed on the upper surface 12a of the semiconductor substrate 12. Each of the pillar regions 39 makes a Schottky connection to the upper electrode 14. As shown in FIG. 1, each of the pillar regions 39 extends downward from a position exposed on the upper surface 12a, penetrates the upper low-concentration body region 25c and reaches the barrier region 38. Each of the pillar regions 39 makes contact with the barrier region 38.

The semiconductor substrate 12 further comprises a drift region 27, a buffer region 28, a collector region 30, and a cathode region 44.

The drift region 27 is an n-type region, and is provided under the body region 24. The drift region 27 extends over the IGBT area 20 and the diode area 40. The drift region 27 makes contact with the body region 24 from below. More specifically, the drift region 27 makes contact with the low-concentration body region 25b in the IGBT area 20 from below, and makes contact with the low-concentration body region 25b in the diode area 40 from below as well. In the border inter-trench semiconductor region 62a, the drift region 27 makes contact with the lower low-concentration body region 25d from below. In the IGBT area 20, the drift region 27 is separated from the emitter regions 22 by the IGBT body region 24a. As described above, each of the trenches 60 penetrates the body region 24, so the lower ends of the respective trenches 60 reach the drift region 27. The drift region 27 makes contact with the gate insulating films 32 and the insulating films 46 in vicinities of the lower ends of the respective trenches 60. An n-type impurity concentration of the drift region 27 is lower than that of the barrier region 38.

The buffer region 28 is an n-type region, and is provided under the drift region 27. The buffer region 28 makes contact with the drift region 27 from below. The buffer region 28 extends over the IGBT area 20 and the diode area 40. An n-type impurity concentration of the buffer region 28 is higher than that of the drift region 27.

The collector region 30 is a p-type region, and is provided in a partial area under the buffer region 28 (that is, under the drift region 27). The collector region 30 is provided within the IGBT area 20. The collector region 30 makes contact with the buffer region 28 from below. The collector region 30 is provided in a range that is exposed on the lower surface 12b of the semiconductor substrate 12. The collector region 30 makes an ohmic contact with the lower electrode 16. The collector region 30 is separated from the body region 24 by the drift region 27 and the buffer region 28.

The cathode region 44 is an n-type region having a higher n-type impurity concentration than the buffer region 28. The cathode region 44 is provided in another partial area under the buffer region 28 (that is, under the drift region 27). The cathode region 44 is provided within the diode area 40. The cathode region 44 makes contact with the buffer region 28 from below. The cathode region 44 is bordering with the collector region 30. The cathode region 44 is provided in a range that is exposed on the lower surface 12b of the semiconductor substrate 12. The cathode region 44 makes an ohmic contact with the lower electrode 16. A border 82 between the cathode region 44 and the collector region 30 is positioned in a range directly below the trench 60a at the border between the IGBT area 20 and the diode area 40 (in a range that is shifted in the z direction from the trench 60a).

A lifetime control region 52 is provided in the drift region 27. A crystal defect density of the lifetime control region 52 is higher than a crystal defect density of the drift region 27 on its outer side. Crystal defects in the lifetime control region 52 are formed by injecting charged particles such as helium ions to the semiconductor substrate 12. The crystal defects formed as above serve as carrier recombination centers. Due to this, carrier lifetime is shorter in the lifetime control region 52 as compared to the drift region 27 on the outer side of the lifetime control region 52. The lifetime control region 52 is arranged in the drift region 27 on an upper surface 12a side than an intermediate depth DI of the drift region 27 (that is, center portion in the thickness direction (z direction) of the drift region 27). If the lifetime control region 52 is arranged on the upper surface 12a side than the intermediate depth DI of the drift region 27, the electrons and holes can effectively be recombined upon the reverse recovery operation of the diode. The lifetime control region 52 is provided over an entirety of the diode area 40 in lateral directions (x direction and y direction) of the semiconductor substrate 12. Further, the lifetime control region 52 is not provided in the IGBT area 20.

In the IGBT area 20, the IGBT is configured of the emitter regions 22, the IGBT body region 24a, the drift region 27, the buffer region 28, the collector region 30, the gate electrodes 34, the gate insulating films 32, and the like. In the diode area 40, the diode is configured of the anode region 24b, the drift region 27, the buffer region 28, the cathode region 44, and the like. The dummy electrodes 48 prevent electric field accumulation within the diode area 40.

An operation of the IGBT in a state where a higher potential is applied to the lower electrode 16 than the upper electrode 14 will be described. When the potential of the gate electrodes 34 is raised to equal to or greater than a threshold, channels (inverted layers) are generated in the low-concentration body region 25b in the vicinities of the gate insulating films 32. Then, the electrons flow from the upper electrode 14 to the lower electrode 16 through the emitter regions 22, the channels, the drift region 27, the buffer region 28, and the collector region 30. At the same time, the holes flow from the lower electrode 16 to the upper electrode 14 through the collector region 30, the buffer region 28, the drift region 27, the low-concentration body region 25b, and the body contact regions 25a. That is, the IGBT turns on and the current flows therein. When the potential of the gate electrodes 34 is reduced to less than the threshold, the channels disappear, and the IGBT turns off. In the semiconductor device 10, since no lifetime control region 52 is provided within the drift region 27 of the IGBT area 20, a resistance of the drift region 27 when the IGBT is on is low. Thus, in the semiconductor device 10, the on-voltage of the IGBT is low, and the steady-state loss generated during when the IGBT is on is small.

Notably, in the border inter-trench semiconductor region 62a, there is a case where the IGBT turns on in two stages as described below. In considering a case where the potential of the gate electrodes 34 is gradually increased, when the potential of the gate electrodes 34 reaches the predetermined potential, the channels are formed first in the lower low-concentration body region 25d having the low p-type impurity concentration. At this stage, no channel is formed in the upper low-concentration body region 25c. Then, as shown by an arrow 70 in FIG. 1, the electrons flow from the upper electrode 14 to the lower electrode 16 through the pillar regions 39, the barrier region 38, channels in the lower low-concentration body region 25d, the drift region 27, the buffer region 28, and the collector region 30. Due to this, at this stage, the current starts to flow in the border inter-trench semiconductor region 62a. Thereafter, when the potential of the gate electrodes 34 is further increased, the channels are generated also within the upper low-concentration body region 25c, and the IGBT is completely turned on. At this stage, the current flowing in the border inter-trench semiconductor region 62a increases. As above, in the border inter-trench semiconductor region 62a, the two-stage turn-on, that is, the current starts to flow at a stage where the channels are generated in the lower low-concentration body region 25d and the current suddenly increases at the stage where the channels are generated in the upper low-concentration body region 25c, takes place. This two-stage turn-on is not problematic in the practical usage of the IGBT, however, this two-stage turn-on may in some cases be detected erroneously as a property defect in an inspection process of the IGBT. In the semiconductor device 10, the pillar regions 39 and the barrier region 38 are provided only within the border inter-trench semiconductor region 62a, and are not provided in other inter-trench semiconductor regions 62. Thus, an influence of the two-stage turn-on is minimized in the IGBT performance of the semiconductor device 10 as a whole, so the aforementioned problem of erroneous detection does not occur.

Next, an operation of the diode will be described. When a higher potential is applied to the upper electrode 14 than the lower electrode 16, the diode in the diode area 40 turns on. That is, the holes flow from the upper electrode 14 into the drift region 27 through the anode region 24b. At the same time, the electrons flow from the lower electrode 16 into the drift region 27 through the cathode region 44 and the buffer region 28. Due to this, the drift region 27 comes to have a lower resistance due to a conductivity modulation phenomenon, and the holes and electrons flow through the drift region 27 at a low loss. The holes in the drift region 27 flow to the lower electrode 16 through the buffer region 28 and the cathode region 44. The electrons in the drift region 27 flow to the upper electrode 14 through the anode region 24b. Thereafter, when the potential of the upper electrode 14 is switched to a potential lower than the potential of the lower electrode 16, the diode performs the reverse recovery operation. That is, the holes present in the drift region 27 are discharged to the upper electrode 14 through the anode region 24b. Due to this, a reverse current (so-called reverse recovery current) flows instantaneously in the diode. A loss (so-called reverse recovery loss) is generated in the diode due to this reverse recovery current flowing therethrough. However, in the semiconductor device 10, the recombination of the holes and electrons in the drift region 27 is enhanced by the lifetime control region 52. Due to this, the holes that are discharged to the upper electrode 14 upon the reverse recovery operation is smaller in number. Due to this, the reverse recovery current is suppressed, and the reverse recovery loss is suppressed.

Further, a parasitic diode is configured on a passage shown by an arrow 72 in FIG. 2 at the border between the IGBT area 20 and the diode area 40. This parasitic diode is configured by the body contact regions 25a in the border inter-trench semiconductor region 62a, the upper low-concentration body region 25c, the barrier region 38, the lower low-concentration body region 25d, the drift region 27, the buffer region 28, and the cathode region 44. A pn junction is formed at an interface between the upper low-concentration body region 25c and the barrier region 38. The lower low-concentration body region 25d is a p-type region, however, since its p-type impurity concentration is low, the electrons and holes can pass through the lower low-concentration body region 25d at a low loss. Thus, the parasitic diode on the passage shown by the arrow 72 can be regarded as being a diode having its pn junction at the interface between the upper low-concentration body region 25c and the barrier region 38. The parasitic diode turns on when the diode in the diode area 40 turns on, and the parasitic diode performs a reverse recovery operation when the diode in the diode area 40 performs the reverse recovery operation. As shown by the arrow 72, no lifetime control region 52 is provided on the current passage of the parasitic diode. Due to this, in the reverse recovery operation of the parasitic diode, a reverse recovery loss suppression effect by the lifetime control region 52 cannot be obtained therein. However, in the parasitic diode, reverse recovery loss suppression effect by the barrier region 38 and the pillar regions 39 can be obtained. Hereinbelow, an operation of the parasitic diode will be described in detail.

When the potential of the upper electrode 14 gradually rises upon turning on the diode in the diode area 40, the electrons start to flow from the lower electrode 16 to the upper electrode 14 through the cathode region 44, the buffer region 28, the drift region 27, the lower low-concentration body region 25d, the barrier region 38, and the pillar regions 39. That is, the electrons flow through the barrier region 38 and the pillar regions 39 at a stage where the potential of the upper electrode 14 is still rising. Since the barrier region 38 is connected to the upper electrode 14 via the pillar regions 39, a potential difference between the barrier region 38 and the upper electrode 14 is small at this stage. Due to this, a potential difference is less likely to be generated in the pn junction at the border between the barrier region 38 and the upper low-concentration body region 25c, so this pn junction does not turn on at this stage. When the potential of the upper electrode 14 is further increased, the current by the aforementioned electrons increases, and the potential difference between the barrier region 38 and the upper electrode 14 becomes larger. When this potential difference reaches a predetermined potential difference, the pn junction at the interface between the barrier region 38 and the upper low-concentration body region 25c turns on. That is, the holes flow from the upper electrode 14 into the drift region 27 through the upper low-concentration body region 25c, the barrier region 38, and the lower low-concentration body region 25d. Due to this, the current flowing in the parasitic diode increases. Accordingly, in this parasitic diode, the electrons flow through the bather region 38 and the pillar regions 39 before the pn junction at the interface between the barrier region 38 and the upper low-concentration body region 25c turns on. Due to this, a timing at which the pn junction turns on is delayed, and the holes are suppressed from flowing into the drift region 27. Accordingly, upon the reverse recovery operation of the parasitic diode, the holes that are discharged from the drift region 27 to the upper electrode 14 are reduced in their number. Thus, in this diode, the reverse recovery loss is suppressed.

As described above, although no lifetime control region 52 is provided on the current passage of the parasitic diode, the reverse recovery loss is suppressed by the barrier region 38 and the pillar regions 39 in the reverse recovery operation of the parasitic diode. Due to this, in the border inter-trench semiconductor region 62a that operates as the IGBT as well as the parasitic diode, the reverse recovery loss of the parasitic diode is suppressed by the barrier region 38 and the pillar regions 39, and at the same time, the steady-state loss of the IGBT is suppressed by the absence of the lifetime control region 52. When seeing the semiconductor device 10 as a whole, the reverse recovery loss is suppressed by the lifetime control region 52 in the diode in the diode area 40, and the reverse recovery loss is suppressed by the barrier region 38 and the pillar regions 39 in the parasitic diode. Due to this, in this semiconductor device 10, the reverse recovery loss in diodes is small. Further, since no lifetime control region 52 is provided in the drift region 27 of the IGBT area 20, the steady-state loss of the IGBT is small in this semiconductor device 10. Accordingly, in this semiconductor device 10, the reverse recovery loss in the diode of the diode area 40 and the reverse recovery loss in the parasitic diode at the border can be suppressed while suppressing the steady-state loss of the IGBT.

Further, in this semiconductor device 10, the barrier region 38 and the pillar regions 39 are not provided in the respective inter-trench semiconductor regions 62 in the diode area 40. It is possible to operate as a diode even if the barrier region 38 and the pillar regions 39 are provided in the respective inter-trench semiconductor regions 62. However, when such barrier region 38 and pillar regions 39 are provided, an adjustment of a property of the diode of the diode area 40 becomes difficult, and a diode property variation becomes large upon mass production of the semiconductor device 10. By not having the barrier region 38 and the pillar regions 39 provided in the diode area 40 as in the semiconductor device 10 of the present embodiment, the diode property variation upon mass production can be suppressed. That is, by employing the lifetime control region 52 instead of the barrier region 38 and the pillar regions 39 for the reduction of the reverse recovery loss in the diode of the diode area 40, the reduction of the reverse recovery loss in the diode can be achieved while stabilizing the property of the diode of the diode area 40.

Figure 4:
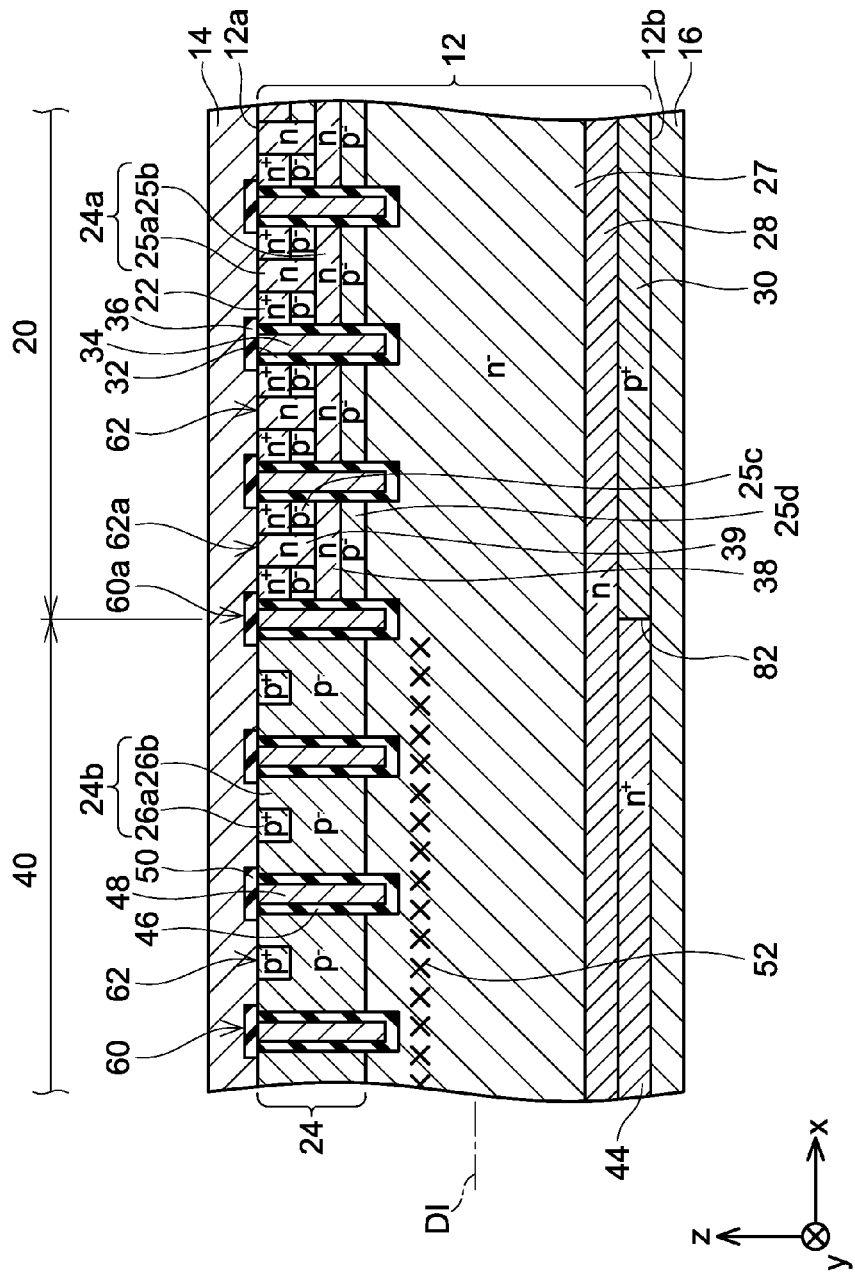
FIG. 4 is a vertical cross sectional view of a semiconductor device of a first variant corresponding to FIG. 1.
Figure 5:
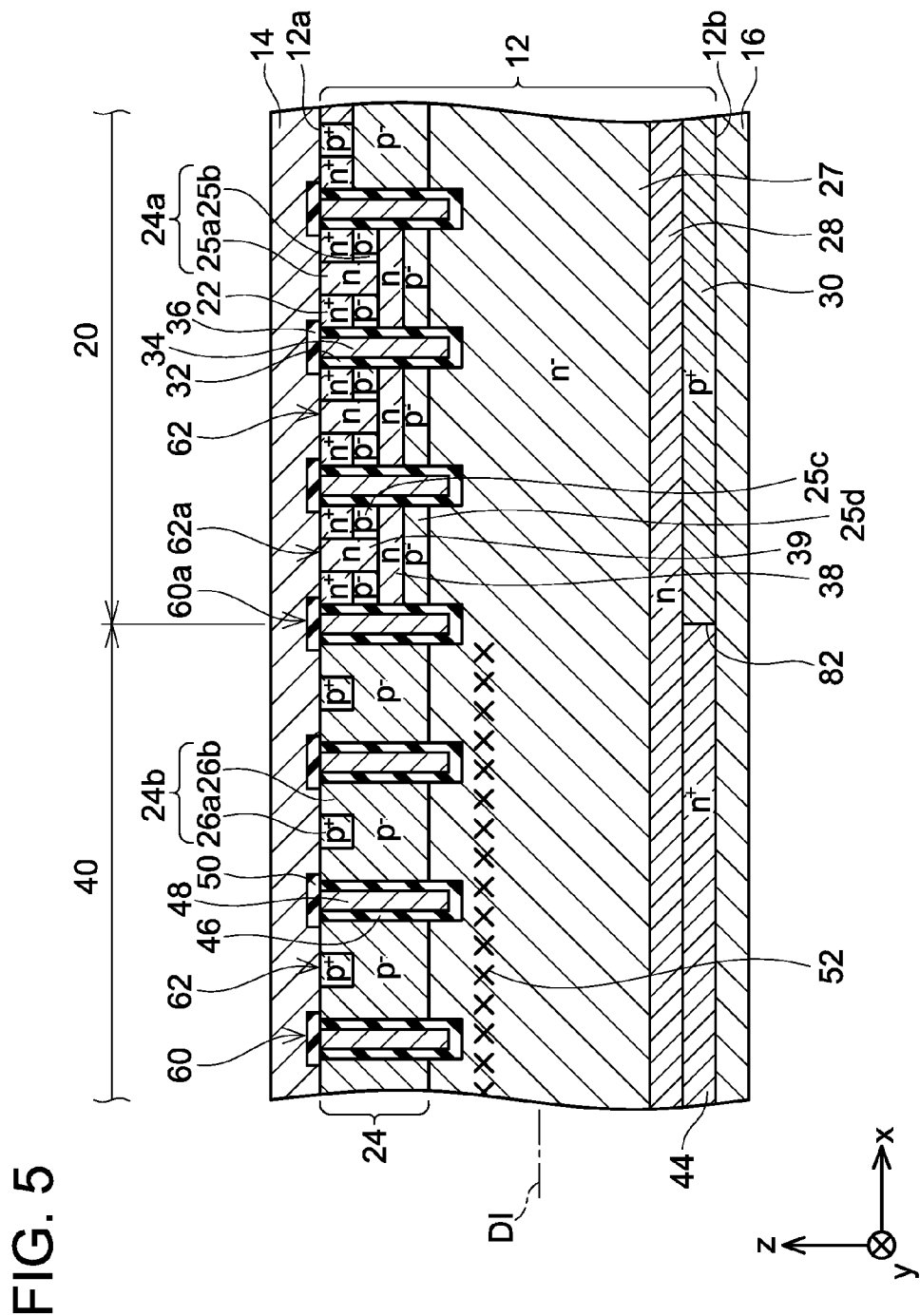
FIG. 5 is a vertical cross sectional view of a semiconductor device of a second variant corresponding to FIG. 1.

Notably, in the aforementioned embodiment, the barrier region 38 and the pillar regions 39 were provided only in the border inter-trench semiconductor region 62a. However, in cases where the two-stage turn-on of the IGBT does not become problematic, barrier regions 38 and pillar regions 39 may be provided in all of the inter-trench semiconductor regions 62 in the IGBT area 20 as shown in FIG. 4. Further, as shown in FIG. 5, the barrier region 38 and the pillar regions 39 may be provided in a plurality of inter-trench semiconductor regions 62 in a vicinity of the diode area 40.

Figure 6:
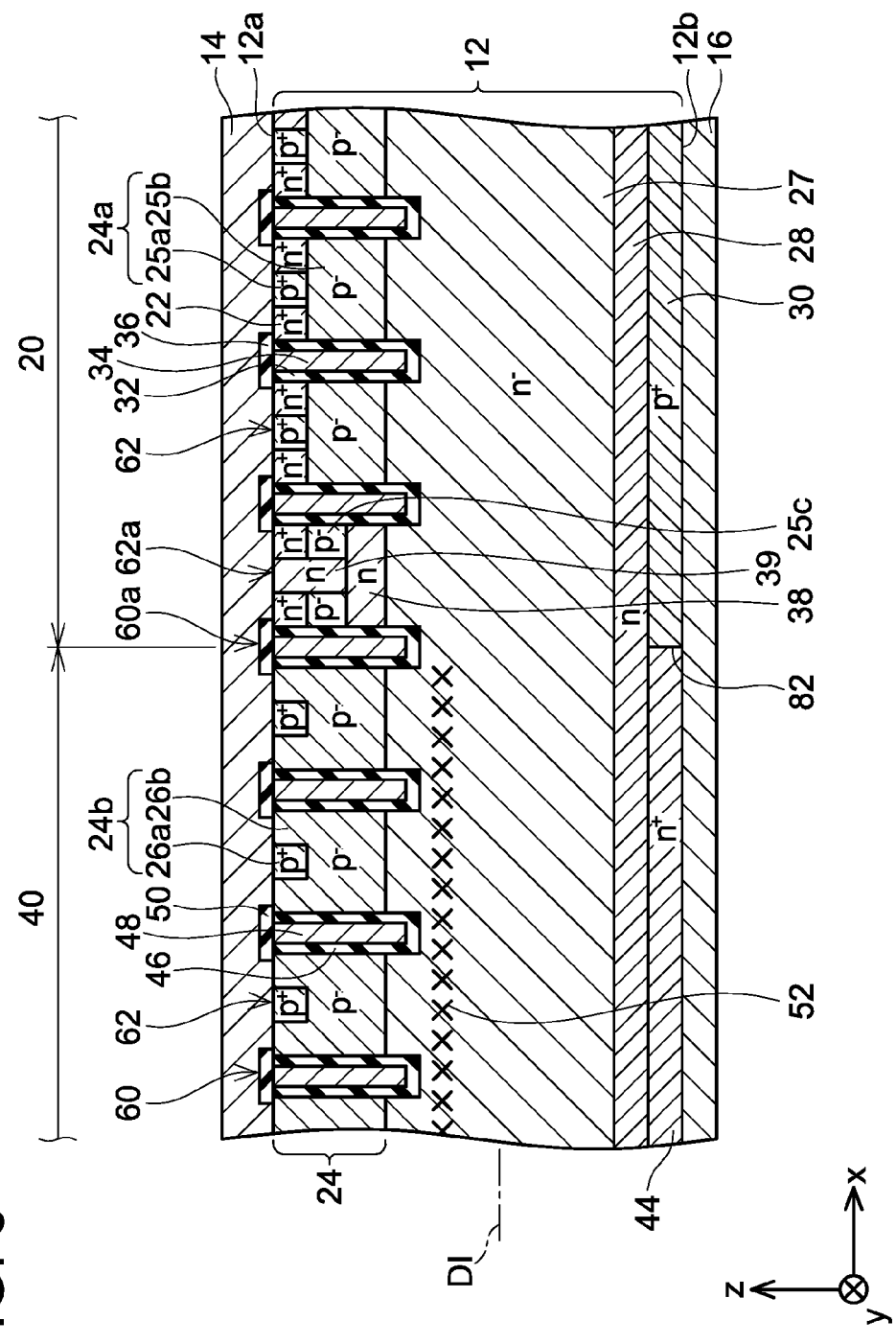
FIG. 6 is a vertical cross sectional view of a semiconductor device of a third variant corresponding to FIG. 1.

Further, in the aforementioned embodiment, the lower low-concentration body region 25d was arranged between the barrier region 38 and the drift region 27. However, as shown in FIG. 6, the lower low-concentration body region 25d may be absent, and the barrier region 38 and the drift region 27 may be in contact. Even with such a structure as well, the reverse recovery loss of the parasitic diode can be suppressed by the barrier region 38 and the drift region 27.

Figure 7:
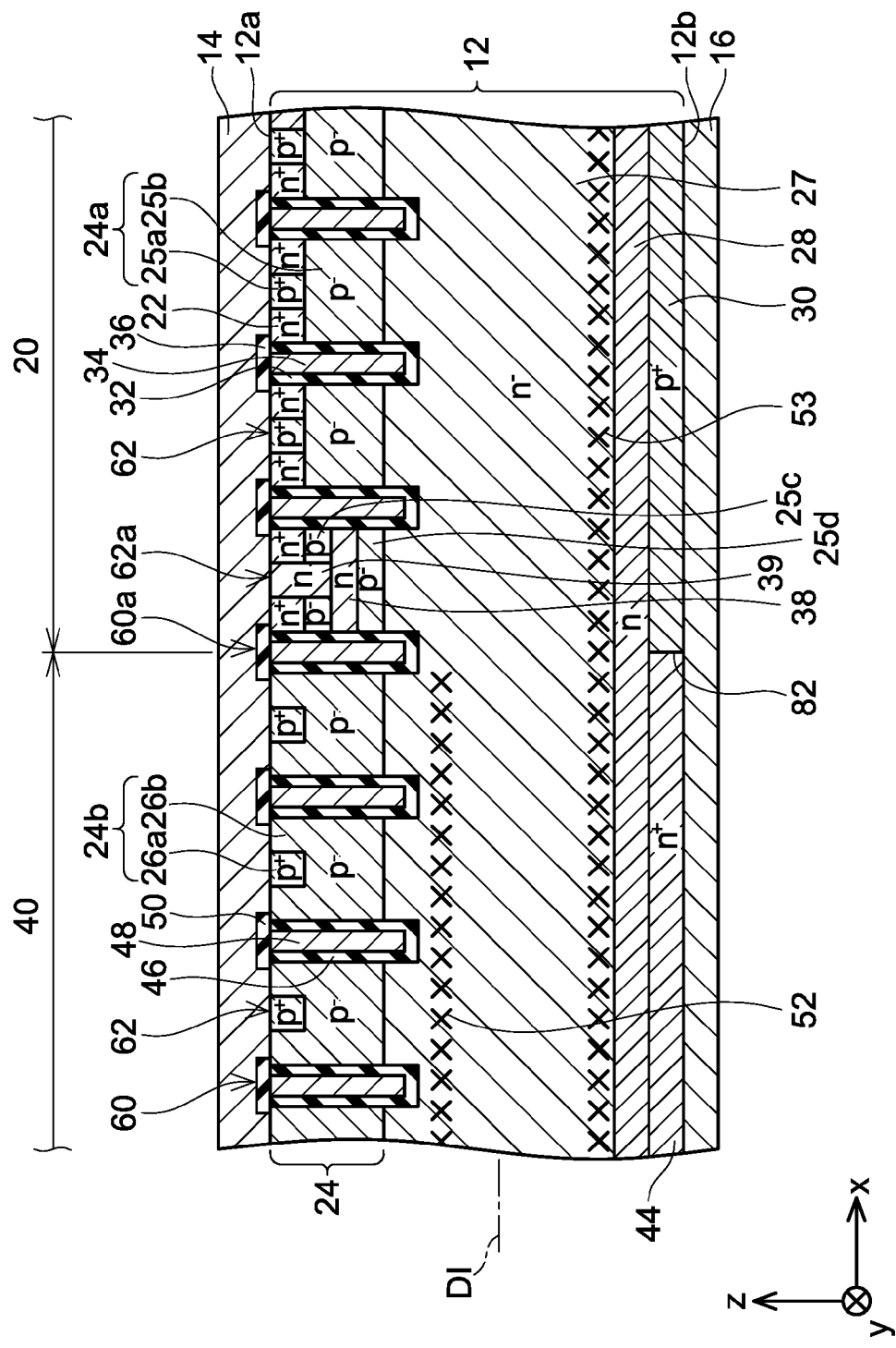
FIG. 7 is a vertical cross sectional view of a semiconductor device of a fourth variant corresponding to FIG. 1.

Further, in the aforementioned embodiment, no lifetime control region was provided in the IGBT area 20. However, a lifetime control region may be provided in the IGBT area 20 so long as it is within the drift region 27 on a lower surface 12b side than the intermediate depth DI. For example, as shown in FIG. 7, a lifetime control region 53 (region having a high crystal defect density) may be provided. When the lifetime control region is provided in the drift region 27 on the lower surface 12b side within the IGBT area 20, an on-voltage of the IGBT increases, while a turn-off speed of the IGBT can be increased. Due to this, a turn-off loss of the IGBT is reduced while the steady-state loss of the IGBT increases. That is, in a case of providing the lifetime control region in the drift region 27 on the lower surface 12b side, a part of IGBT property can be improved.

Figure 8:
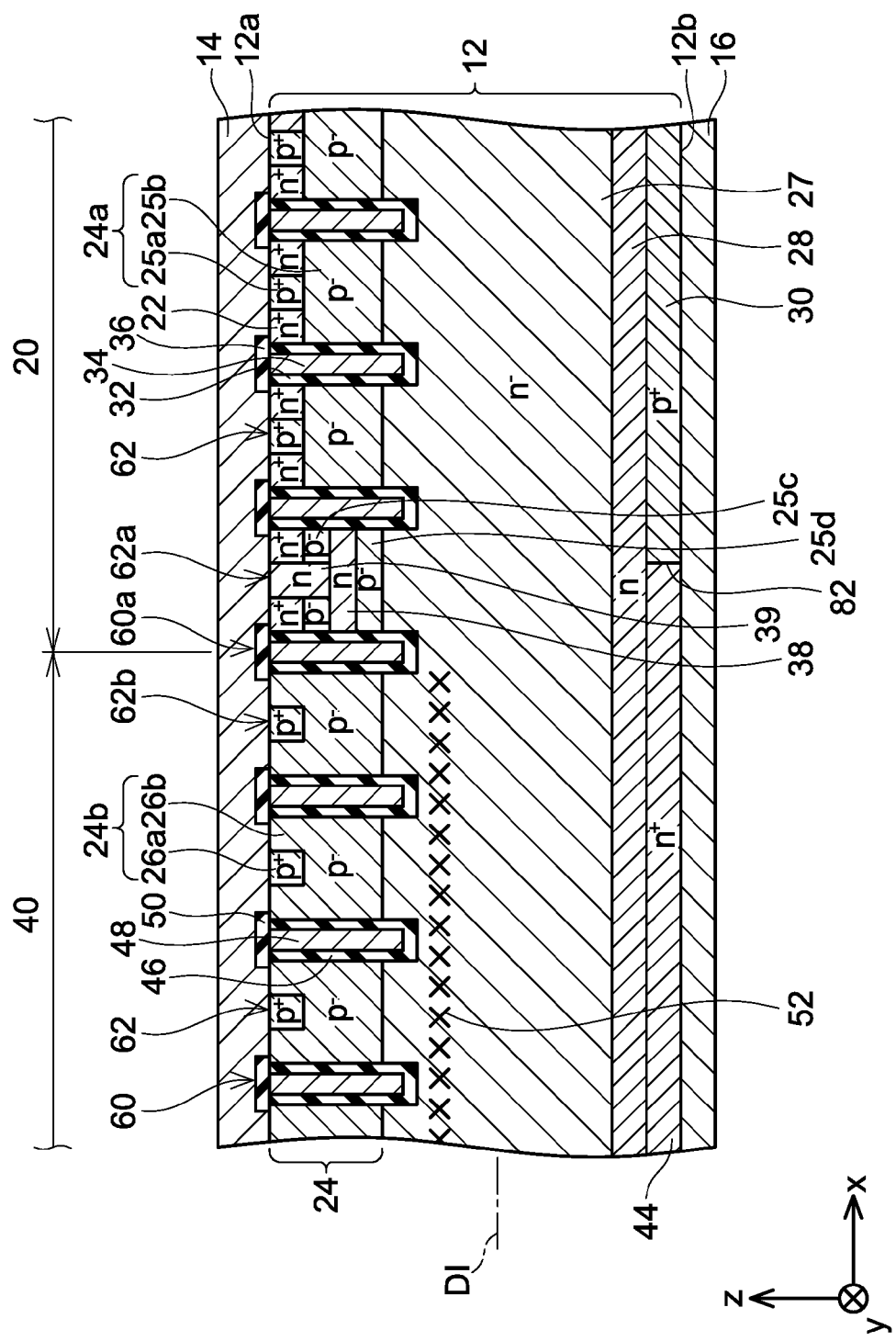
FIG. 8 is a vertical cross sectional view of a semiconductor device of a fifth variant corresponding to FIG. 1.

Further, in the aforementioned embodiment, the border 82 between the collector region 30 and the cathode region 44 was positioned in the range directly below the trench 60a at the border between the IGBT area 20 and the diode area 40. However, the border 82 may be offset from the position of the trench 60a at the border so long as it is within a range directly below the inter-trench semiconductor regions 62 provided adjacent to the trench 60a at the border (that is, inter-trench semiconductor regions 62a, 62b in FIGS. 8 and 9). For example, as shown in FIG. 8, the border 82 may be offset to an IGBT area 20 side of the trench 60a, or as shown in FIG. 9, the border 82 may be offset to a diode area 40 side of the trench 60a.

Further, variants shown in FIG. 4 to FIG. 9 may be used in combination.

Further, in the aforementioned embodiment, the pillar regions 39 were in Schottky contact with the upper electrode 14. However, the pillar regions 39 may be in ohmic contact with the upper electrode 14.

Further, in the aforementioned embodiment, no barrier region (n-type region that divides the low-concentration anode region 26 to two parts above and under) was provided in the diode region 40. However, so long as no pillar region is provided in the diode region 40, a barrier region may be provided in the diode region 40. This is because so long as the barrier region is not connected to the upper electrode 14 by the pillar region, an influence which the barrier region imposes on the diode property is small.

Further, in the aforementioned embodiment, the semiconductor device 10 comprised the buffer region 28. However, there may be no buffer region 28, and the drift region 27 may be in direct contact with the collector region 30 and the cathode region 44. Further, the buffer region 28 may be regarded as a part of the drift region 27.

A relationship between the constituent features of the aforementioned embodiment and the constituent features of the claims will be described. The body region 24 (that is, the body contact region 24a, the low-concentration body region 24b, the anode contact region 42a, and the low-concentration anode region 42b) in the embodiment is an example of the body region in the claims.

The gate electrode 34 and the dummy electrode 48 in the embodiment are an example of the trench electrodes in the claims. The inter-trench semiconductor regions 62 in the IGBT area 20 in the embodiment are an example of the first inter-trench semiconductor regions in the claims. The inter-trench semiconductor regions 62 in the diode area 40 in the embodiment are an example of the second inter-trench semiconductor regions in the claims. The border inter-trench semiconductor region 62a in the embodiment is an example of the border first inter-trench semiconductor region in the claims.

Some suitable configuration of the aforementioned embodiment will be listed below. Notably, the configurations listed hereinbelow are each independently useful.

In one aspect of the semiconductor device disclosed herein, a lower body region of the p-type may be located between the barrier region and the drift region. Each of the first inter-trench semiconductor regions other than the border first inter-trench semiconductor region may not comprise the barrier region and the pillar region.

In the case where the lower body region is present, the barrier region and the pillar region may give rise in some cases to the phenomenon in which the collector current is increased in two steps (so-called two-stage turn-on) upon when the IGBT turns on. The two-stage turn-on is not problematic regarding the IGBT property, however, it may be a cause of an erroneous detection in the IGBT inspection process. Due to this, the influence of the two-stage turn-on can be minimized by limiting the IGBT in which the two-stage turn-on takes place to be located only at the border as above.

In another aspect of the semiconductor device disclosed herein, the border between the cathode region and the collector region may be located in a range directly below the border trench.

According to this configuration, the IGBT and the diode can effectively be operated.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A semiconductor device including an IGBT and a diode, the semiconductor device comprising:
   a semiconductor substrate;
   an upper electrode covering an upper surface of the semiconductor substrate; and
   a lower electrode covering a lower surface of the semiconductor substrate;
   wherein
   the semiconductor substrate comprises:
   a body region of a p-type being in contact with the upper electrode;
   a drift region of an n-type located on a lower side of the body region;
   a cathode region of the n-type located in a part of a range on a lower side of the drift region, being in contact with the lower electrode, and having an n-type impurity concentration higher than the drift region; and
   a collector region of the p-type located in another part of the range on the lower side of the drift region, and being in contact with the lower electrode at a position bordering the cathode region,
   wherein
   a plurality of trenches is provided on the upper surface of the semiconductor substrate, the plurality of trenches penetrating the body region and reaching the drift region,
   a trench electrode insulated from the semiconductor substrate and the upper electrode by an insulating film is located in each of the trenches,
   the semiconductor substrate comprises a plurality of inter-trench semiconductor regions, each of the inter-trench semiconductor regions being intervened between the adjacent trenches,
   the plurality of inter-trench semiconductor regions comprises a plurality of first inter-trench semiconductor regions adjacent to each other and a plurality of second inter-trench semiconductor regions adjacent to each other,
   each of the first inter-trench semiconductor regions comprises an emitter region of the n-type being in contact with the upper electrode and the insulating film and separated from the drift region by the body region,
   each of the second inter-trench semiconductor regions does not comprise the emitter region,
   a range in which the plurality of first inter-trench semiconductor regions is located in a plan view of the semiconductor substrate is an IGBT area, and a range in which the plurality of second inter-trench semiconductor regions is located in the plan view of the semiconductor substrate is a diode area,
   at least a part of the collector region is located in the IGBT area,
   at least a part of the cathode region is located in the diode area,
   a border between the cathode region and the collector region is located in a range directly below a border trench and two of the inter-trench semiconductor regions bordering the border trench, the border trench being one of the trenches that is located at a border between the IGBT area and the diode area,
   an upper-side lifetime control region is provided in the diode area and is not provided in the IGBT area, the upper-side lifetime control region being a region extending along a planar direction in the drift region within a range located above an intermediate depth of the drift region, and the upper-side lifetime control region having a crystal defect density higher than the drift region surrounding the upper-side lifetime control region,
   one of the first inter-trench semiconductor regions that is adjacent to the second inter-trench semiconductor regions is a border first inter-trench semiconductor region,
   the border first inter-trench semiconductor region comprises:
   a barrier region of the n-type located between the body region and the drift region and having an n-type impurity concentration higher than the drift region; and
   a pillar region of the n-type extending from a position being in contact with the upper electrode to a position being in contact with the barrier region, and
   each of the second inter-trench semiconductor regions does not comprise the pillar region.

2. The semiconductor device of claim 1, wherein
   a lower body region of the p-type is located between the barrier region and the drift region, and
   each of the first inter-trench semiconductor regions other than the border first inter-trench semiconductor region does not comprise the barrier region and the pillar region.

3. The semiconductor device of claim 1, wherein the border between the cathode region and the collector region is located in a range directly below the border trench.

* * * * *